(12) United States Patent
Seyedi et al.

(10) Patent No.: US 11,469,764 B2
(45) Date of Patent: Oct. 11, 2022

(54) OPTICAL COMB SOURCE FOR CONTENT-ADDRESSABLE MEMORY ENCODERS

(71) Applicant: Hewlett Packard Enterprise Development LP, Houston, TX (US)

(72) Inventors: Mir Ashkan Seyedi, Mountain View, CA (US); Thomas Van Vaerenbergh, Diegem (BE); Antoine Descos, Santa Barbara, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 194 days.

(21) Appl. No.: 17/006,490

(22) Filed: Aug. 28, 2020

(65) Prior Publication Data
US 2022/0069829 A1   Mar. 3, 2022

(51) Int. Cl.
| | | |
|---|---|---|
| G11C 15/04 | (2006.01) |
| H03L 7/093 | (2006.01) |
| H03L 7/099 | (2006.01) |
| H03K 17/78 | (2006.01) |
| G02B 6/12 | (2006.01) |
| G11C 11/42 | (2006.01) |
| H03K 17/95 | (2006.01) |
| H04B 10/2557 | (2013.01) |

(52) U.S. Cl.
CPC .......... *H03L 7/093* (2013.01); *G02B 6/12007* (2013.01); *G11C 11/42* (2013.01); *G11C 15/04* (2013.01); *H03K 17/78* (2013.01); *H03K 17/9537* (2013.01); *H03L 7/0995* (2013.01); *H04B 10/2557* (2013.01)

(58) Field of Classification Search
CPC .......... G11C 15/00; G11C 15/02; G11C 15/04
See application file for complete search history.

(56) References Cited

U.S. PATENT DOCUMENTS

| | | |
|---|---|---|
| 4,318,581 A | 3/1982 | Guest et al. |
| 4,604,707 A | 8/1986 | Yamashita et al. |
| 5,247,473 A | 9/1993 | Houk et al. |
| 5,319,629 A | 6/1994 | Henshaw et al. |

(Continued)

FOREIGN PATENT DOCUMENTS

| | | |
|---|---|---|
| CN | 102326207 A | 1/2012 |
| CN | 104422998 A | 3/2015 |

(Continued)

OTHER PUBLICATIONS

Alkabani et al., "OE-CAM: A Hybrid Opto-Electronic Content Addressable Memory", Dec. 22, 2019, 14 pages.

(Continued)

*Primary Examiner* — Alfredo Bermudez Lozada
(74) *Attorney, Agent, or Firm* — Yao Legal Services, Inc.

(57) ABSTRACT

One embodiment provides an optical encoder. The optical encoder includes an optical comb source to generate a multi-wavelength optical signal; a number of optical filters sequentially coupled to the optical comb source, with a respective optical filter being tunable to pass or block a particular wavelength of the multi-wavelength optical signal based on a corresponding bit value of a multi-bit search word; and a common output for the optical filters to output the filtered multi-wavelength optical signal, which encodes the multi-bit search word and can be used as an optical search signal for searching an optical content-addressable memory (CAM).

20 Claims, 8 Drawing Sheets

(56) References Cited

U.S. PATENT DOCUMENTS

| | | | |
|---|---|---|---|
| 5,333,117 | A | 7/1994 | Ha et al. |
| 6,169,626 | B1 | 1/2001 | Chen et al. |
| 7,903,445 | B2 | 3/2011 | Song et al. |
| 9,614,751 | B2 | 4/2017 | Sekiya et al. |
| 10,367,590 | B2 | 7/2019 | Kielpinski et al. |
| 11,057,143 | B1 | 7/2021 | Van et al. |
| 2004/0170041 | A1 | 9/2004 | Huang |
| 2008/0193133 | A1 | 8/2008 | Krug et al. |
| 2014/0016404 | A1 | 1/2014 | Kim et al. |
| 2014/0176956 | A1 | 6/2014 | Hsieh |
| 2017/0317745 | A1 | 11/2017 | Tezak et al. |
| 2019/0332708 | A1 | 10/2019 | Strachan et al. |
| 2019/0356394 | A1 | 11/2019 | Bunandar et al. |
| 2019/0370652 | A1 | 12/2019 | Shen et al. |
| 2020/0258587 | A1 | 8/2020 | Li et al. |

FOREIGN PATENT DOCUMENTS

| | | |
|---|---|---|
| CN | 109196588 A | 1/2019 |
| CN | 110875076 A | 3/2020 |
| CN | 111210860 A | 5/2020 |
| WO | 2002/017329 A1 | 2/2002 |
| WO | WO-2002017329 | 2/2002 |
| WO | 2019/236591 A1 | 12/2019 |

OTHER PUBLICATIONS

David A. B. Miller, "Self-Configuring Universal Linear Optical Component", Photonics Research, 2013, pp. 1-29.

Hamerly et al., "Large-Scale Optical Neural Networks Based on Photoelectric Multiplication", Phys. Rev. X 9, 021032, May 16, 2019, pp. 021032-1-021032-12.

Han et al., "A tunable optical waveguide ring resonator for microwave photonic filtering", 2013 IEEE International Topical Meeting on Microwave Photonics (MWP 2013), Oct. 2013, pp. 88-91.

Li et al., "Backcoupling manipulation in silicon ring resonators", Photonics Research, vol. 6, No. 6, Jun. 2018, pp. 620-629.

Liang et al., "A Tunable Hybrid III-V-on-Si MOS Microring Resonator with Negligible Tuning Power Consumption", Optical Society of America, 2016, 3 pages.

Mourgias-Alexandris et al., "All-optical 10Gb/s Ternary-cam Cell for Routing Look-up Table Applications", Optics Press, vol. 26, No. 6, Mar. 19, 2018, pp. 7555-7562.

Nahmias et al., "A Leaky Integrate- and-Fire Laser Neuron for Ultrafast Cognitive Computing", IEEE Journal of Selected Topics in Quantum Electronics, vol. 19, No. 5, Sep.-Oct. 2013, 12 pages.

Pandey et al., "Tunable coupling-induced resonance splitting in selfcoupled Silicon ring cavity with robust spectral characteristics", Jun. 12, 2017, 9 pages.

Pitris et al., "An Optical Content Addressable Memory Cell for Address Look-up at 10 GB/s", IEEE Photonics Technology Letters, Aug. 15, 2016, 5 pages.

Reck et al., "Experimental Realization of Any Discrete Unitary Operator", Physical Review Letters, vol. 73, No. 1, Jul. 4, 1994, pp. 58-63.

Shen et al., "Deep learning with coherent nanophotonic circuits", Nature Photonics, vol. 11, Jun. 12, 2017, pp. 441-446.

Tait et al., "Broadcast and Weight: An Integrated Network for Scalable Photonic Spike Processing", Journal of Lightwave Technology, vol. 32, No. 21, Nov. 1, 2014, pp. 3427-3439.

Tait et al., "Neuromorphic photonic networks using silicon photonic weight banks", Scientific Reports, vol. 7, Aug. 7, 2017, pp. 1-10.

Vagionas et al., "Integrated Optical Content Addressable Memories (CAM) and Optical Random Access Memories (RAM) for Ultrafast Address Look-up Operations", Applied Science, Jul. 7, 2017, pp. 1-18.

Alkabani et al.,"OE-CAM: A Hybrid Opto-Electronic Content Addressable Memory", IEEE, 2019, 14 Pages.

Pitris et al., "An Optical Content Addressable Memory Cell for Address Look-Up at 10 GB/s", vol. 28, No. 16, 2016, IEEE, 4 pages.

Vagionas et al., "Integrated Optical Content Addressable Memories (CAM) and Optical Random Access Memories (RAM) for Ultra-Fast Address Look-Up Operations", Applied Sciences, 2017, 18 pages.

Alkabani, Y. et al.; "OE-CAM: A Hybrid Opto-Electronic Content Addressable Memory"; Jan. 2020; 14 pages.

Mourgias-Alexandris, G. et al.; "All-optical 10Gb/s Ternary-cam Cell for Routing Look-up Table Applications"; Mar. 19, 2018; 8 pages.

Pitris, S. et al.; "An Optical Content Addressable Memory Cell for Address Look-up at 10 GB/s"; Aug. 15, 2016; 5 pages.

Vagionas, C. et al.; "Integrated Optical Content Addressable Memories (CAM) and Optical Random Access Memories (RAM) for Ultra-fast Address Look-up Operations"; Jul. 7, 2017; 18 pages.

OPTICAL COMB SOURCE FOR CONTENT-ADDRESSABLE MEMORY ENCODERS

RELATED APPLICATION

This application is related to U.S. patent application Ser. No. 16/905,674, entitled "WAVELENGTH DIVISION MULTIPLEXING (WDM)-BASED AND MULTIPATH INTERFEROMETRY-BASED OPTICAL TERNARY CONTENT ADDRESSABLE MEMORY (TCAM)," filed Jun. 18, 2020, and U.S. patent application Ser. No. 16/905,694, entitled "TIME DIVISION MULTIPLEXING (TDM)-BASED OPTICAL TERNARY CONTENT ADDRESSABLE MEMORY (TCAM)," filed Jun. 18, 2020, the disclosures of which are herein incorporated by reference in their entirety.

BACKGROUND

Field

This disclosure is generally related to an optical encoder. More specifically, this disclosure is related to an optical encoder used to generate an optical search signal for an optical content-addressable memory (CAM).

Related Art

For certain security applications, it is paramount to enable low-latency searches for security keys in an existing database. One example is at a wireless access point, where a user attempts to log in and gain access. Repeated requests can sometimes cause software hang-ups as the access point struggles to keep up with the requests. Software-based search algorithms are inherently limited by the processor and memory access times to load in data, to search, and to generate the response.

Content-addressable memory (CAM) allows for the hardware itself to conduct the search where the data is stored. During search, a data string may be input as search content and the resulting output is an address of a location in the memory that stores matching data. This avoids clock-cycle latencies from the processor and avoids having to load/store data.

Ternary CAM (TCAM) is a type of CAM in which the bit cells can store a wildcard data value (also referred to as "don't care") in addition to two binary data values. When a bit cell that stores the wildcard value is searched, the result is a match regardless of what search criterion is used to search the bit cell. Certain TCAMs may also allow a search to be conducted on the basis of a wildcard search criterion. When a bit cell is searched based on the wildcard search criterion, the result is a match regardless of what value is stored in the bit cell.

Optical CAMs have provided a low-energy and high-speed memory solution. In one approach, the encoded data (i.e., a security key) can be stored in a photonic component, such as a ring filter or a combination of ring filters.

BRIEF DESCRIPTION OF THE FIGURES

In the figures, like reference numerals refer to the same figure elements.

DETAILED DESCRIPTION

Figure 1:
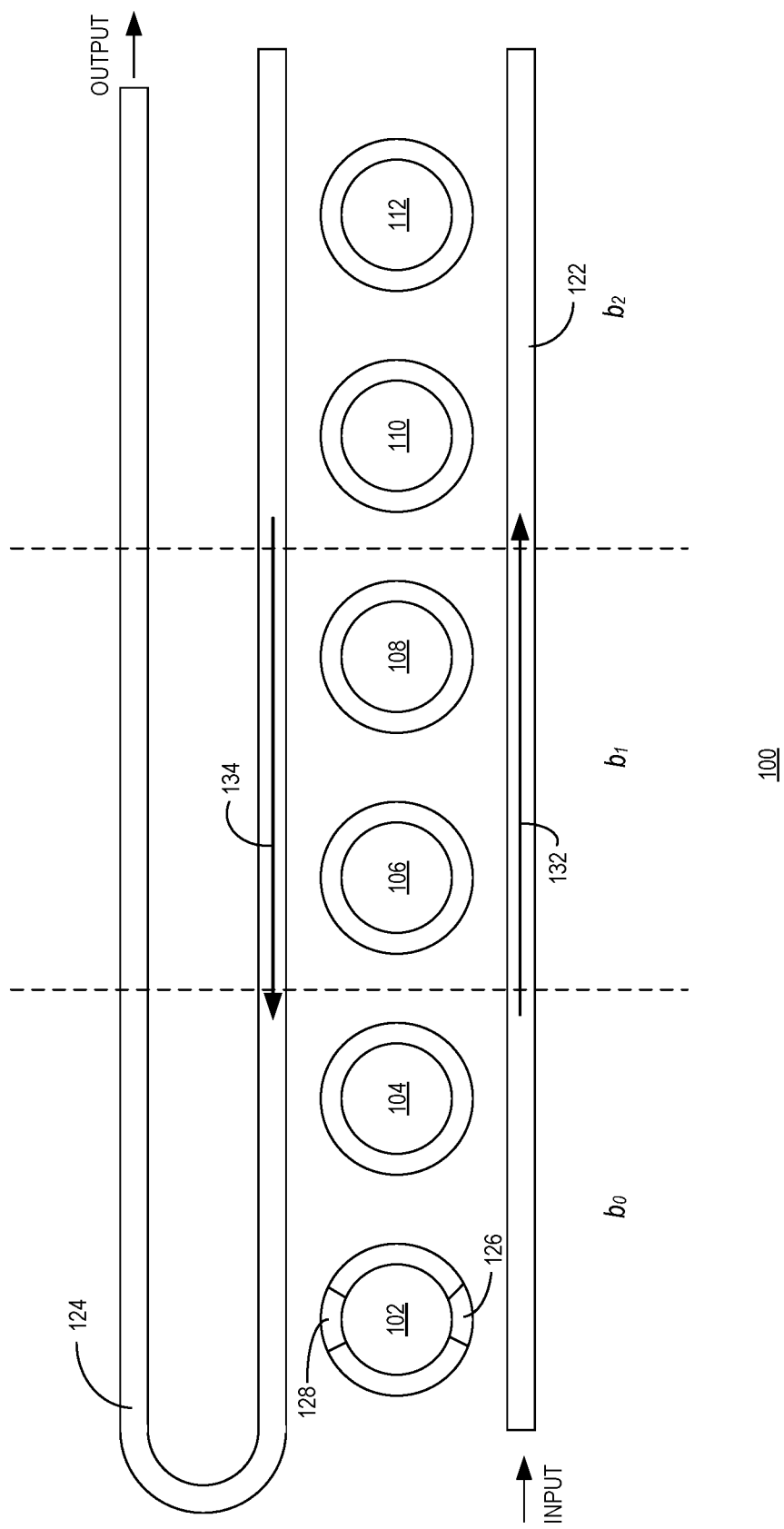
FIG. 1 illustrates an exemplary array of optical-filter-based content-addressable memory (CAM) cells, according to one embodiment.

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

The embodiments described herein can provide an optical encoder that can be used to generate a search word to search an optical TCAM. The optical encoder uses an optical comb source (e.g., a quantum dot laser) as a light source for providing to-be-encoded multi-wavelength optical signals. Each bit (which can have a value of "0," "1," or "don't care") in a search word can be encoded using two wavelengths (e.g., $\lambda_1$ and $\lambda_2$), with the presence of the light in such wavelengths indicating the bit value. The optical encoder can include a number of tunable wavelength filters (e.g., microring resonators). When the multi-wavelength optical signal passes through the encoder, its spectrum will be modified according to the settings of the optical filters. Consequently, a spectral word is generated. Such a spectral word can function as a search signal to search an optical TCAM, which stores encoded data (e.g., data encoded in the spectral domain) in a photonic component (e.g., an array of microring resonators). Moreover, the spectral word can simultaneously read a huge array of bits stored in the optical TCAM, thus significantly speeding up the search process. In one embodiment, two microrings are needed to encode one bit (e.g., by controlling the resonance frequency of each ring). In alternative embodiments, one microring can be used to control the passing or blocking of two wavelengths simultaneously, thus being capable of encoding one bit, which can have a value of "0," "1," or "don't care".

Content-addressable memory (CAM) is a special type of memory generally used in high-speed search applications. In a standard computer memory (e.g., random access memory (RAM)), the user supplies a memory address and the RAM returns the data word stored at that address. However, a CAM is designed such that the user supplies a data word and the CAM searches its entire memory to see if that data word is stored anywhere in it. If the data word is found, the CAM returns a list of one or more storage addresses where the word was found. Because of its parallel nature, CAM is much faster than RAM for searching. Ternary CAM (TCAM) adds a third state to CAM, beyond binary, for a wildcard functionality that provides for variable characters in searches and adds additional complexity to the circuits.

Existing electrical CAMs and TCAMs typically consume large amounts of power and are often used in specialized applications, such as Internet routers and switches, where they can increase the speed of route look-up, packet classification, packet forwarding, and access-control list (ACL) based commands. Current high-speed communication systems typically use encoded optical signals to carry data, meaning that costly optical-to-electrical conversions are required to convert the data from the optical to the electrical domain in order to search an electrical CAM. Consequently, these existing electrical CAM and TCAM implementations increasingly become bottlenecks, reducing the overall efficiency and throughput of the network.

Optical CAMs have recently been developed by researchers. Compared with conventional electrical CAMs, optical CAMs consume less energy and operate at a higher speed. Different types of optical CAMs have been developed; some are based on optical logic (e.g., flip-flops and logic gates) in fiber-based table-top setups, and some are based on integrated silicon photonic devices (e.g., tunable filters). Compared with optical-logic-based CAMs in table-top setups, optical CAMs based on silicon photonics devices are more compact and provide higher energy efficiency. The disclosed embodiments provide an encoder solution for the optical CAMs based on silicon photonics devices, where the search word is encoded in the spectral domain (e.g., as spectral peaks) of a multi-wavelength optical signal.

FIG. 1 illustrates an exemplary array of optical-filter-based CAM cells, according to one embodiment. CAM-cell array 100 can be an entry in an optical memory bank that includes a plurality of entries, with each entry representing a to-be-searched word with a predetermined width. In the example shown in FIG. 1, the to-be-searched word is 3 bits wide, and CAM-cell array 100 includes six filters, which is shown as ring filters 102-112 in FIG. 1. The ring filters can be positioned between an input waveguide 122 and an output waveguide 124. Each filter can include an input coupling region (e.g., input coupling region 126) for coupling with input waveguide 122 and an output coupling region (e.g., output coupling region 128) for coupling with output waveguide 124.

Two filters can form a CAM cell to store one bit value. For example, filters 102 and 104 form a CAM cell storing the value of bit $b_0$, filters 106 and 108 form a CAM cell storing the value of bit $b_1$, and filters 110 and 112 form a CAM cell storing the value of bit $b_2$. For a binary CAM (or BCAM), each CAM cell is capable of storing a logical "0" or a logical "1;" for a ternary CAM (TCAM), each CAM cell is capable of storing a logical "0," a logical "1," or a wildcard value (i.e., "don't care"). In one implementation, storing a word in CAM-cell array 100 can include configuring the tunable filters such that they can pass or block certain wavelengths of a multi-wavelength optical search signal traveling through input waveguide 122. In the example shown in FIG. 1, adjacent filters form a CAM cell. In practice, any filter combination can be possible.

Table 1 shows an exemplary mapping between the bit values and settings of the optical filter pair in each CAM cell.

TABLE 1

| Bit Value | Filter 1 | Filter 2 |
| --- | --- | --- |
| 0 | Pass $\lambda_{i1}$ | Block all $\lambda$s |
| 1 | Block all $\lambda$s | Pass $\lambda_{i2}$ |
| x | Block all $\lambda$s | Block all $\lambda$s |

Each bit position can be assigned two wavelengths (e.g., $\lambda_{i1}$ and $\lambda_{i2}$, with i indicating the bit position). As shown in Table 1, each of the two filters (i.e., filter 1 and filter 2) can be tuned independently to pass either $\lambda_{i1}$ or $\lambda_{i2}$. More specifically, to store a bit value "0," filter 1 can be tuned to pass $\lambda_{i1}$, whereas filter 2 can be tuned to block all wavelengths included in the multi-wavelength search signal. In one implementation, filter 2 can be tuned to pass an arbitrary wavelength $\beta_{i2}$ that is different from $\lambda_{i1}$ and $\lambda_{i2}$ (e.g., a wavelength between $\lambda_{i1}$ and $\lambda_{i2}$). To store a bit value "1," filter 1 can be tuned to block all wavelengths included in the multi-wavelength search signal (e.g., be tuned to an arbitrary wavelength $\beta_{i1}$ that is different from $\lambda_{i1}$ and $\lambda_{i2}$), whereas filter 2 can be tuned to pass $\lambda_{i2}$. On the other hand, to store a wildcard value, both filters can be tuned to block all wavelengths included in the multi-wavelength search signal (e.g., be tuned to arbitrary wavelengths $\beta_{i1}$ and $\beta_{i2}$, respectively). It is also possible for $\beta_{i1}$ and $\beta_{i2}$ to be wavelengths that are outside of the range between $\lambda_{i1}$ and $\lambda_{i2}$. In addition to the mapping listed in Table 1, other mappings can also be possible. For example, the filter settings for bit values "0" and "1" can be swapped.

Using CAM-cell array 100 in FIG. 1 as an example, if $b_0$ is "0," filter 102 will be tuned to pass $\lambda_{01}$ and filter 104 will be tuned to block all wavelengths included in the multi-wavelength search signal. On the other hand, if $b_1$ is "1," filter 106 will be tuned to block all wavelengths included in the multi-wavelength search signal and filter 108 will be tuned to pass $\lambda_{12}$; and if $b_2$ is "0," filter 110 will be tuned to pass $\lambda_{21}$ and filter 112 will be tuned to block all wavelengths included in the multi-wavelength search signal. By tuning the passing wavelengths of the filters, a 3-bit word 010 can be stored in CAM-cell array 100. Alternatively, if the settings of filters 102-108 remain unchanged, while both filters 110 and 112 are tuned to block all wavelengths included in the multi-wavelength search signal, CAM-cell array 100 is configured to store the 3-bit word 01x.

FIG. 1 also shows that filters 102-112 can be ring filters and a multi-wavelength optical search signal can be inputted to input waveguide 122. As the multi-wavelength optical search signal travels along input waveguide 122 (as indicated by arrow 132), light of a particular wavelength (e.g., $\lambda_{i1}$ or $\lambda_{i2}$) can be coupled to output waveguide 124, via a corresponding ring filter and the input and output coupling regions of the corresponding ring filter. The light travelling direction in output waveguide 124 is indicated by arrow 134. In fact, in FIG. 1, each ring filter, input waveguide 122, and output waveguide 124 form an add-drop ring resonator, with input waveguide 122, and output waveguide 124 being the common bus waveguide for all ring filters. The input port of input waveguide 122 is the common input port for all ring filters, and the output port of output waveguide 124 is the common drop port for all ring filters. In other words, the resonating wavelength can be filtered through output waveguide 124. In the aforementioned example, if the multi-wavelength search signal inputted by input waveguide 122 includes a peak at $\lambda_{01}$, filter 102 will route $\lambda_{01}$ to output waveguide 124; otherwise, filter 102 will not add any light to output waveguide 124. In addition to the add-drop ring resonators shown in FIG. 1, all-pass ring resonators can also be used as CAM cells. In such a scenario, all rings will be coupled to a single bus waveguide, which serves as both the input waveguide and the output waveguide, with the search signal inputted from one end of the bus waveguide and the search output detected at the other end of the bus waveguide.

In one implementation, the search algorithm can be designed such that a stored bit matches a corresponding bit in the search word if the optical filters in the CAM cell generate no light at output waveguide 124. Otherwise, there is a mismatch. This way, a match word can be found if none of the filters in the CAM-cell array generates light at the output waveguide. By placing a photo detector (PD) at the output port of output waveguide 124, one can detect the presence of the light, and hence whether the stored word matches the search word.

Figure 2:
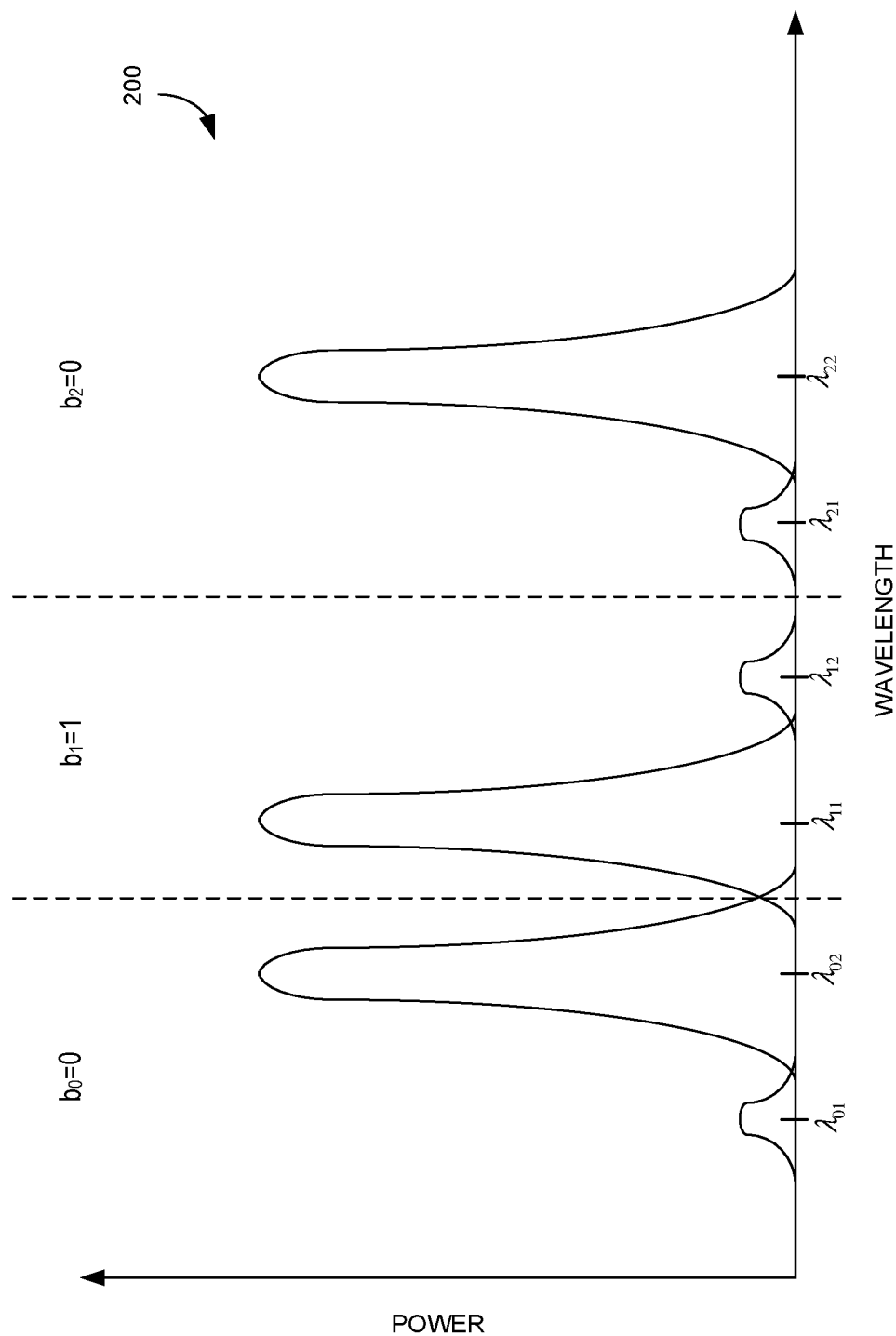
FIG. 2 illustrates the spectrum of an exemplary search signal used to search an optical CAM, according to one embodiment.

FIG. 2 illustrates the spectrum of an exemplary search signal used to search an optical CAM, according to one embodiment. In FIG. 2, spectrum 200 can include a number of strong peaks, such as peaks at wavelengths $\lambda_{02}$, $\lambda_{11}$, and $\lambda_{22}$, whereas at other wavelengths, such as wavelengths $\lambda_{01}$, $\lambda_{12}$, and $\lambda_{21}$, the optical power can be much weaker. If such a search word is inputted into aforementioned CAM-cell array 100, where filters 102, 108, and 110 are tuned to pass $\lambda_{01}$, $\lambda_{12}$, and $\lambda_{21}$, respectively, the amount of light that can be coupled to output waveguide 124 will be minimum, indicating a match word is found. Spectrum 200 represents a 3-bit search word 010. As discussed before, each bit in the search word can be encoded using light intensities of two corresponding wavelengths (e.g., $\lambda_{i1}$ and $\lambda_{i2}$, with i indicating the bit position).

Table 2 shows the mapping between the search word bit values and spectral intensity of the optical search signal, where a value "1" in the spectra intensity pair indicates a strong peak at the corresponding wavelength, and "0" indicates a weak peak or no peak at the corresponding wavelength.

TABLE 2

| Search Word Bit Value | Spectral Intensity ($\lambda_{i1}$, $\lambda_{i2}$) |
| --- | --- |
| 0 | (0, 1) |
| 1 | (1, 0) |
| x | (0, 0) |

For example, if the bit value is "0" for $b_0$, then the spectrum of the search signal should have a null (i.e., no peak or a weak peak) at $\lambda_{01}$ and a strong peak at $\lambda_{02}$. On the other hand, $b_1=1$ means that the spectrum has a strong peak at $\lambda_{11}$ and a null at $A_{12}$; and $b_2=0$ means that the spectrum has a null at $\lambda_{21}$ and a strong peak at $\lambda_{22}$. According to the mapping in Table 2, the spectrum of the search signal corresponding to 3-bit search word 010 will be spectrum 200 shown in FIG. 2. Note that the wildcard or "don't care" bit value is encoded as nulls in both wavelengths.

Various ways can be used to encode the search word corresponding to Table 2. A straightforward method is to use a number of single wavelength lasers to generate a wavelength division multiplexing (WDM) signal. Each laser can be configured to generate a carrier frequency at a fixed spectral spacing. By turning on and off lasers of particular wavelengths according to the bit-value mapping table, multi-bit words can be encoded into the WDM or multi-wavelength signals. However, this approach can be bulky and consumes too much energy.

Figure 3:
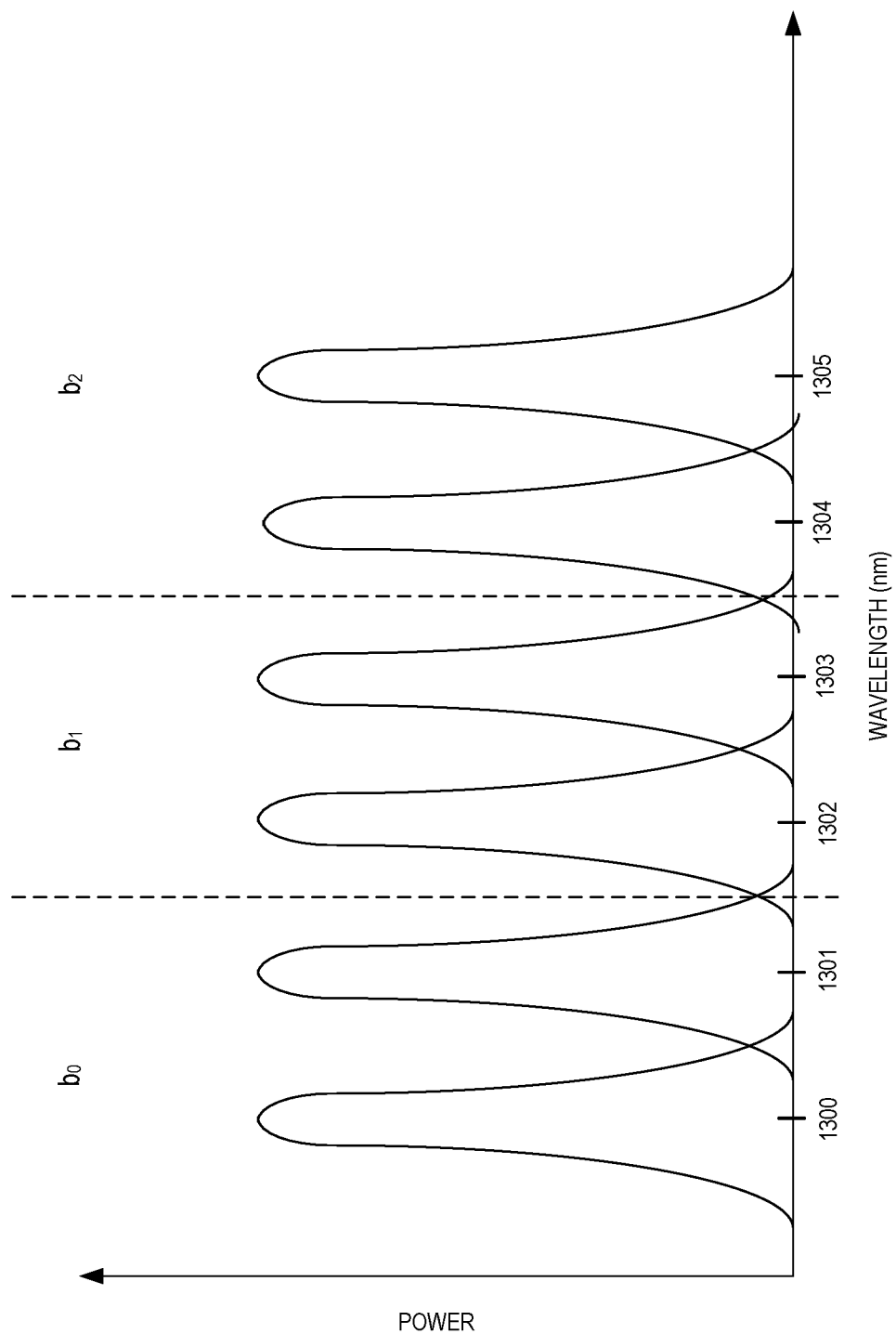
FIG. 3 illustrates the output spectrum of an exemplary multi-wavelength comb source for an encoder, according to one embodiment.

In some embodiments, instead of multiple single wavelength lasers, a multi-wavelength comb source can be used as the light source for creating the search signal. FIG. 3 illustrates the output spectrum of an exemplary multi-wavelength comb source for an encoder, according to one embodiment. In FIG. 3, a multi-wavelength comb source can generate an optical signal comprising a number of equally spaced carriers. For example, the wavelengths of the six carriers in FIG. 3 can be 1300 nm, 1301 nm, 1302 nm, 1303 nm, 1304 nm, and 1305 nm. Every two adjacent carriers can be assigned to a bit position. Hence, the six carriers can be used to create a 3-bit word. For example, 1300 nm and 1301 nm can be assigned to bit 0 ($b_0$), 1302 nm and 1303 nm can be assigned to bit 1 ($b_1$), and 1304 nm and 1305 nm can be assigned to bit 2 ($b_2$).

Each bit can be associated with the amplitudes of light at the two assigned wavelengths. For a binary encoding implementation, the non-zero amplitude at one wavelength represents a bit value of "0," the non-zero amplitude at the other wavelength represents a bit value of "1," and zero amplitude at both wavelengths represents the wildcard or "don't care" value. The mapping between the bit value and the amplitude (or intensity) of light at particular wavelengths can be similar to what is shown in Table 2. In some embodiments, the amplitude of light at a given wavelength can be controlled by analog attenuation of the power at the wavelength to be below or above some threshold value (e.g., 0.5 mW). That is, to encode a 3-bit word, the amplitude of one or more of the six wavelengths can be adjusted such that the power of light measured at certain wavelengths can be above the threshold value, while the power of light measured at other wavelengths can be below the threshold value. Using the notation in Table 2, the light power at a wavelength is marked as 1 if it is above the threshold and marked as 0 if it is below the threshold. Accordingly, a 3-bit search word $b_0b_1b_2=010$ can be converted to a 6-bit wavelength word $\lambda_{01}\lambda_{02}\lambda_{11}\lambda_{12}\lambda_{21}\lambda_{22}=011001$, meaning that the light power at 1301 nm, 1302 nm, and 1305 nm is above the threshold and the light power at 1300 nm, 1303 nm, and 1304 nm is below the threshold. Similarly, a search word 110 can be converted to a wavelength word 010110; and a search word x10 (x indicates "don't care") can be converted to a wavelength word 000110.

In addition to the mapping shown in Table 2, other types of mapping can also be possible. For example, bit value "0" can be mapped to wavelength bits "10," and bit value "1" can be mapped to wavelength bits "01." Note that the decoder needs to be designed according to the encoding mapping. For example, the decoder shown in FIG. 1 may need to be redesigned, if the encoding mapping is not the same as the mapping shown in Table 2. For example, instead of measuring optical power at the common drop port of the ring filters, the search algorithm can measure optical power at the common pass port of the ring filters to determine if a match has been found.

As discussed previously, the wavelength word or bits can be generated by attenuating the output of a multi-wavelength comb source at particular wavelengths, depending on the bit values. In some embodiments, such attenuation can be accomplished using filters, such as ring filters.

Figure 4:
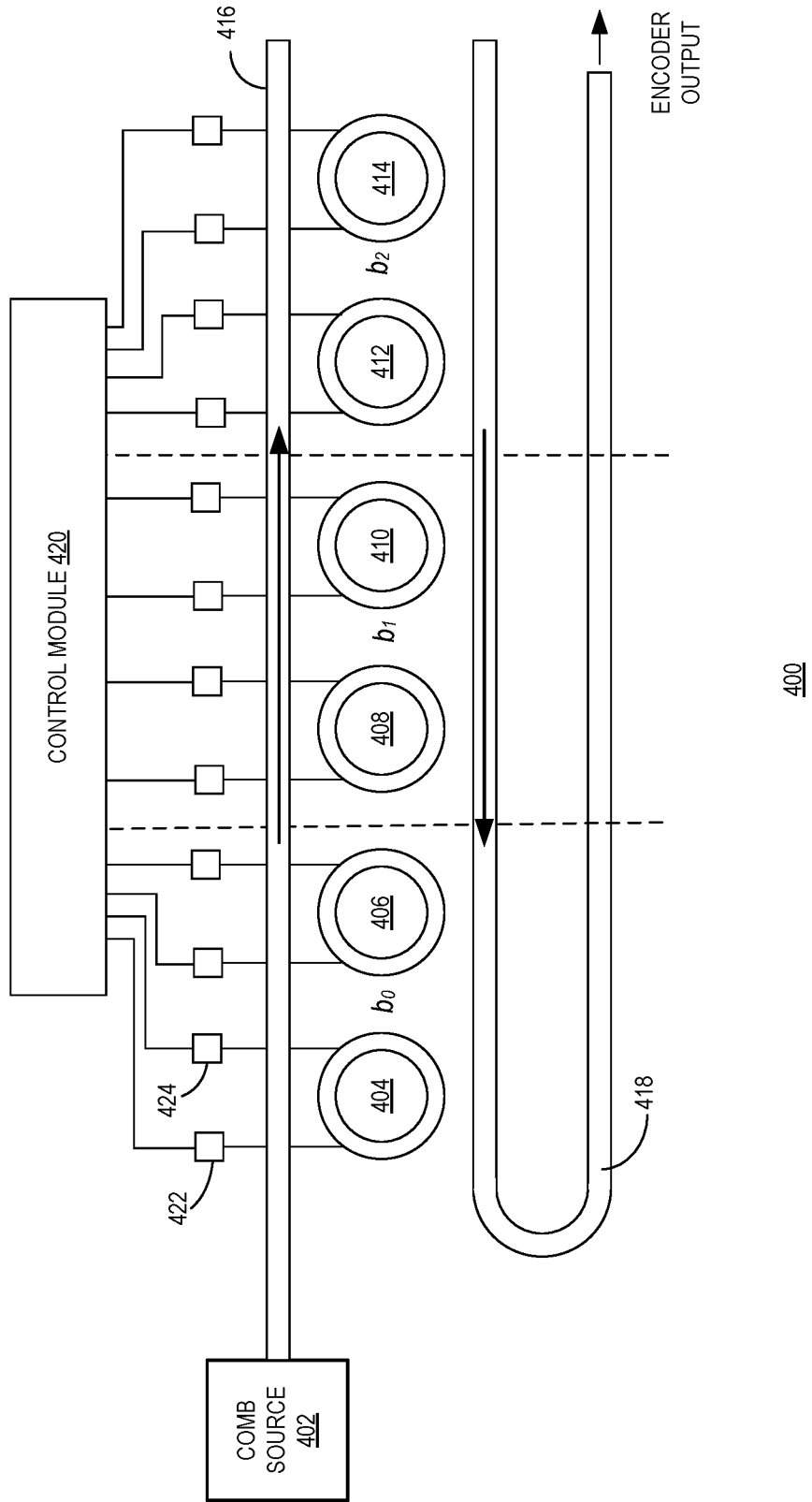
FIG. 4 illustrates an exemplary encoder for generating a search signal, according to one embodiment.

FIG. 4 illustrates an exemplary encoder for generating a search signal, according to one embodiment. Encoder 400 can include comb source 402 and a number of ring filters (e.g., ring filters 404-414) positioned between an input waveguide 416 and an output waveguide 418.

Comb source 402 can output a multi-wavelength continuous wave (CW) optical signal. Depending on the length of the search word, the minimum number of required wavelengths can be different. For example, to generate the aforementioned 3-bit search word, comb source 402 needs to output a CW signal with at least six wavelengths, with the spectrum of the light similar to what is shown in FIG. 3. In some embodiments, comb source 402 can be a standalone module, such as a mode locked laser (MLL) module. In alternative embodiments, comb source 402 can be an on-chip component that is integrated with other components (e.g., the ring filters and the waveguides) of encoder 400.

In one embodiment, comb source 402 can include a comb laser and an array of ring lasers. The comb laser generates a multi-wavelength signal and each wavelength can be used to lock a corresponding ring laser. The collective outputs of the ring lasers can be the output of comb source 402 to be fed to ring filters 404-414. Using multiple ring lasers to generate the search signal can ensure a relatively high output power and a relatively flat spectrum, with each wavelength having roughly the same optical power.

Ring filters 404-414 can be closed loop resonators coupled to input waveguide 416 and output waveguide 418. In the example shown in FIG. 4, the resonating components are ring-shaped. In practice, other shapes (e.g., oval, race track, rectangles, etc.) can also be possible. As an alternative to resonators, other types of optical filters can also be used in encoder 400, such wavelength-selective interferometers, including but not limited to: coupled microring resonators, Mach-Zehnder interferometers (MZIs), lattice filters, photonic crystal cavity-based filters, Bragg filters, etc. In various embodiments, the optical filters may be implemented as bandpass filters, configured to enable light having a particular wavelength to be filtered out of the multi-wavelength signal (i.e., the output of comb source 402) traveling through input waveguide 416 in a direction indicated by the arrow in input waveguide 416. The outputs of the filters can be collected by output waveguide 418 and travel along a direction indicated by the arrow in output waveguide 418.

To facilitate a compact encoder, in some embodiments, ring filters 404-414 can include silicon photonic microring resonators, and waveguides 416 and 418 can include silicon-based waveguides. In the examples shown in FIG. 4, the ring filters are aligned in a straight line, and input waveguide 416 and output waveguide 418 both include straight waveguide sections having an equal spacing to all ring filters. In practice, other geometrical configurations are also possible. For example, the ring filters can be aligned along a curve, and waveguides 416 and 418 can also be curved. Also in FIG. 4, output waveguide 418 includes two parallel straight sections and a curved section connecting the straight sections. Such a configuration ensures that the encoder output is at the opposite side of comb source 402; or at the output port, the light travels in the same direction as the output direction of comb source 402. Other configurations are also possible. For example, output waveguide 418 can include only the straight section, and the output of encoder 400 can be at the same side as comb source 402. The layout of the waveguides can be determined based on the packaging need. In an alternative embodiment, each filter can include two coupled microrings (e.g., in a coupled resonator optical waveguide (CROW) configuration) positioned between the input and output waveguides. In such a scenario, the light propagates in the output waveguide in the same direction as in the input waveguide, thus providing timing advantages.

In various embodiments, each optical filter (e.g., ring filters 404-414) may be tunable to pass or block one of two different wavelengths depending on the bit position of the search word with which the optical filter is associated. In the example shown in FIG. 4, the filters can be divided into a number of groups of two filters. Each group can be associated with a bit position of the to-be-encoded search word. For example, the group comprising ring filters 404 and 406 is associated with $b_0$, the group comprising ring filters 408 and 410 is associated with $b_1$, and the group comprising ring filters 412 and 414 is associated with $b_2$. As discussed previously, each bit position can be assigned two wavelengths. In the example shown in FIG. 4, those two wavelengths can be selected from the wavelengths provided by comb source 402. Although it is possible to assign wavelengths to each bit position arbitrarily, as long as different bit positions are assigned different wavelengths, for simplicity of wavelength management, the wavelengths can be assigned in a sequential manner, with each bit position being assigned adjacent wavelengths and adjacent bit positions being assigned adjacent pairs of wavelengths, in a way similar to what is shown in FIG. 3.

When encoding a search word, each ring filter can be tuned to pass or block a particular wavelength to the output waveguide by tuning its resonance frequency depending on the bit values of the search word. In some embodiments, the mapping relationship between the search word bit value and the passing wavelength can be similar to what is shown in Table 2, with "0" indicating the wavelength being blocked and "1" indicating the wavelength being passed. Note that when a particular wavelength is blocked, it also means that all other possible wavelengths provided by the comb source are blocked.

For example, according to Table 2, for $b_0=0$, the corresponding wavelengths bits are 01, meaning that the corresponding filter pair (e.g., ring filters 404 and 408) should block $\lambda_{01}$ and pass $\lambda_{02}$. Note that filters 404 and 408 can be designed such that the tuning range of their resonance wavelengths can include $\lambda_{01}$ and $\lambda_{02}$. In some embodiments, the ring filters can be narrow band filters. Hence, to block $\lambda_{01}$, one can simply tune the resonance wavelength of ring filter 404 away from $\lambda_{01}$. To prevent interference to other wavelengths, the resonance wavelength of ring filter 404 can be set at a wavelength that is different from any wavelength provided by comb source 402. In one embodiment, to block $\lambda_{01}$, the resonance wavelength of ring filter 404 can be tuned to be between $\lambda_{01}$ and $\lambda_{02}$. To pass $\lambda_{02}$, the resonance wavelength of ring filter 406 can be tuned to $\lambda_{02}$, thus routing $\lambda_{02}$ to output waveguide 418. Similarly, for $b_1=1$, the resonance wavelength of ring filter 408 can be tuned to $\lambda_{11}$ in order to route $\lambda_{11}$ to output waveguide 148, whereas the resonance wavelength of ring filter 410 can be tuned away from $\lambda_{12}$ (e.g., tuned to be between $\lambda_{11}$ and $\lambda_{02}$) to prevent $\lambda_{12}$ from entering output waveguide 418. On the other hand, for $b_2$ being the wildcard, both ring filters 412 and 414 can be tuned away from $\lambda_{21}$ and $\lambda_{22}$ to prevent both wavelengths from entering output waveguide 418.

FIG. 4 also shows that encoder 400 includes a control module 420, which is coupled to each ring filter via a number of electrodes. For example, control module 420 is coupled to ring filter 404 via electrodes 422 and 424. Various tuning techniques can be used to tune the resonance of the ring filters, including but not limited to: thermal tuning, injection or depletion of free carriers, etc. In general, any effect that can change the refractive index and/or geometry of the ring waveguide can cause the resonance wavelength to shift. For example, local heating (e.g., by embedding a heater beneath the ring waveguide) can create a red shift of the resonance wavelength. Such a thermal effect can have a response speed in the range between a few kilohertz to a few megahertz. On the other hand, a free-carrier dispersion effect (e.g., using either injection modulation or depletion modulation of carriers) can have a response speed between 10 and 25 gigahertz. Controlling the number of free carriers in the ring makes it possible to induce a blue shift of the ring resonance wavelength. In the example shown in FIG. 4, each ring is coupled to two control electrodes, which can be used to power a heater or to inject/deplete carriers to/from the ring waveguide. In alternative embodiments, there can be a different number of electrodes (e.g., four or more electrodes) coupled to each ring, such that two electrodes are used to power a heater and the other two electrodes are used to inject carriers.

In alternative embodiments, the tunable ring filters can include MOS-based microring resonators, which can generate a free-carrier plasma dispersion effect with high power efficiency. Alternative tuning techniques are also possible, such as implementing non-volatile phase-change materials or optomechanical techniques. Most of these techniques aim to tune the phase of the light in the ring waveguide by changing the refractive index of the core or cladding of the ring waveguide.

Due to the limited tuning range and to reduce the amount of energy needed for tuning, each ring filter can be fabricated to have slightly different dimensions such that the tuning range of each filter can correspond to the wavelengths assigned to the bit position. For example, if a particular ring is associated with bit 0 and is assigned a wavelength of 1300 nm, then this particular ring is designed in such a way that its resonance wavelength is about 1300 nm. In one embodiment, each bit position is associated with two rings and two adjacent wavelengths, and the two rings can be configured to have their tuning ranges centered at different wavelengths. In one embodiment, each bit position is associated with two rings and two adjacent wavelengths, and the two rings can be configured to have their tuning ranges centered at different wavelengths. In another embodiment, the two rings associated with the same bit position can be configured to have their tuning ranges centered at the same wavelength, which can be a wavelength positioned between the two wavelengths assigned to the bit position. For example, if bit 0 is assigned a wavelength pair of 1300 nm and 1301 nm, the two rings associated with bit 0 can both be configured to have their tuning ranges centered at 1300.5 nm. This way, during the encoding operation, each ring only needs to tune its resonance wavelength by about 0.5 nm.

Note that, for TCAM application, a minimum of two wavelengths is needed for each bit position. In the aforementioned examples (e.g., examples shown in FIG. 1 and FIG. 4), the encoder and decoder each implements two rings for each bit position, one ring per wavelength. These two rings can be independently tuned to block or pass a particular wavelength. According to Table 2, depending on whether the bit value is 0 or 1, one of the two rings in the encoder can be tuned to pass its corresponding wavelength while the other one is tuned to block its corresponding wavelength and all other wavelengths provided by the comb source. In some embodiments, each ring filter can be pre-configured to pass its corresponding wavelength (i.e., its resonance wavelength is set to its corresponding wavelength) in its natural state (e.g., without heating or carrier modulation). Accordingly, depending on the bit value, only one filter needs to be actively tuned away from its default resonance wavelength. This approach can reduce the amount of energy needed for encoding.

Figure 5:
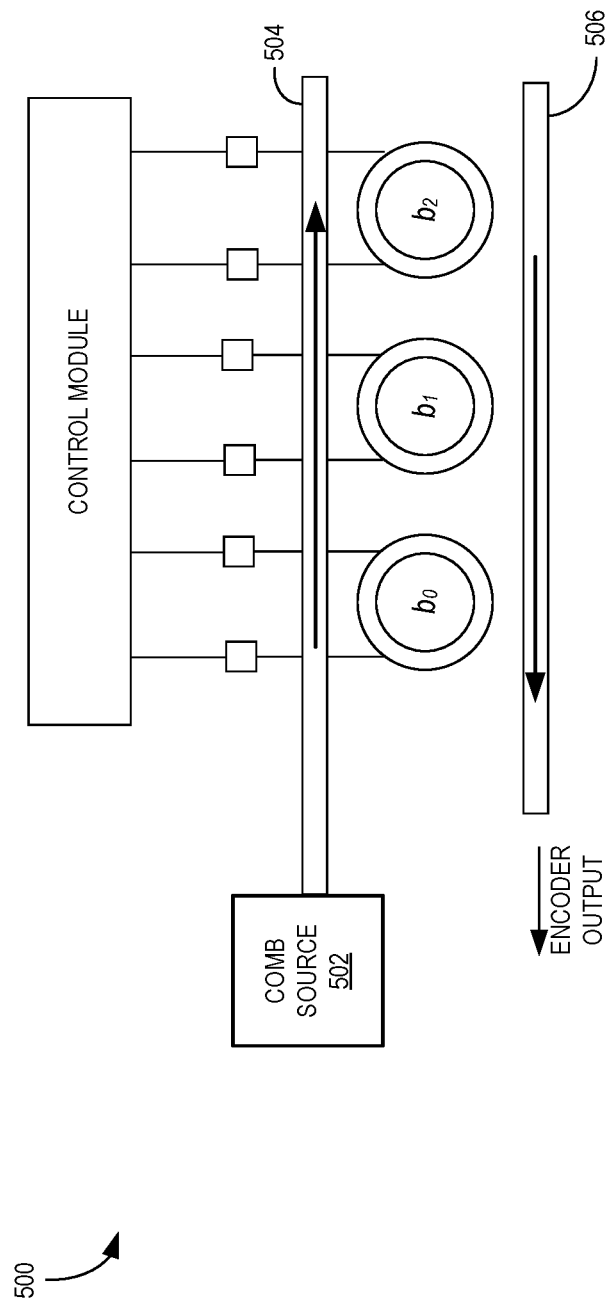
FIG. 5 illustrates an exemplary three-bit encoder, according to one embodiment.

To reduce the size of the encoder, in some embodiments, it is also possible to use just one filter per bit position to encode a search word. FIG. 5 illustrates an exemplary three-bit encoder, according to one embodiment. Three-bit encoder 500 can include a comb source 502 and three ring filters (one per bit) positioned between an input waveguide 504 and an output waveguide 506. Compared with three-bit encoder 400 shown in FIG. 4, three-bit encoder 500 can be significantly smaller. Moreover, the reduced number of ring filters to tune also reduces the energy consumption.

Comb source 502 can be similar to comb source 402 shown in FIG. 4 and can be configured to output an optical comb with at least six wavelengths. Each bit position (e.g., $b_0$, $b_1$, and $b_2$) can be assigned two wavelengths and the bit value can be encoded into the passing/blocking of the wavelengths. The mapping between the spectral intensity of the output of the encoder and the bit value can be similar to what is shown in Table 2.

Similar to what is shown in FIG. 4, the output of comb source 502 enters input waveguide 504 and portions of the light can be coupled to and outputted by output waveguide 506, depending on the resonance setting of the three ring filters. Output waveguide 506 serves as the common drop port for all three ring filters, allowing light having the resonance wavelength of any filter to be dropped. In FIG. 5, both input and output waveguides 504 and 506 are straight and the output port of encoder 500 can be on the same side as comb source 502.

Using one ring filter with its tuning range covering both wavelengths, the mapping between the wavelengths and the bit value can be achieved. For example, if $b_0=0$, the resonance wavelength of the ring filter associated with $b_0$ can be tuned to $\lambda_{01}$, allowing $\lambda_{01}$ to be outputted by encoder 500; if $b_0=1$, the resonance wavelength of such ring filter can be tuned to $\lambda_{02}$, allowing $\lambda_{02}$ to be outputted by encoder 500; and if $b_0=x$ or "don't care," the resonance wavelength of such ring filter can be tuned away from either $\lambda_{01}$ or $\lambda_{02}$, thus simultaneously blocking both wavelengths. The configurations of the other two filters can be similar. This implementation requires that each ring filter has a relatively large tuning range and that there is a relatively large difference between two adjacent wavelengths outputted by the comb source, which can lead to reduced spectral efficiency. The corresponding decoder (i.e., the CAM cell) design can either have the two-ring-per-bit design or the one-ring-per-bit design. As long as the decoder can correctly decode the spectral word, the decoder can have a different filter structure than that of the encoder.

In alternative embodiments, each ring filter in FIG. 5 may use other effects to pass/block two wavelengths. In one embodiment, the resonance-splitting effect can be used to expand the passing/blocking bandwidth of the ring filter. For example, tunable back reflections can be introduced in the ring (e.g., via adding sidewall corrugations on the ring waveguide, and by inserting isolators to reduce reflections in unwanted directions), causing the ring filter to have two resonance dips on its pass port, thus being capable of blocking two wavelengths simultaneously. Alternatively, a pair of coupled ring resonators with tunable coupling can have a similar double-dip pass-port spectrum, making it possible to block two wavelengths simultaneously. This also means that two such wavelengths will be passed to the drop port simultaneously.

In addition, it is also possible to use other mechanisms to control the blocking and passing of an additional wavelength to achieve simultaneous control of two wavelengths. In some embodiments, the coupling between the input or output waveguide and the ring can be tuned such that light of a particular wavelength can or cannot be coupled into the ring. Such coupling can be tuned via an interferometer structure (e.g., an MZI). This approach relaxes the bandwidth requirement of each ring filter as well as the requirement on the spacing between adjacent wavelengths of the comb source. However, it does require additional running of the coupling region, in addition to the running of the resonance wavelength of each ring.

Figure 6:
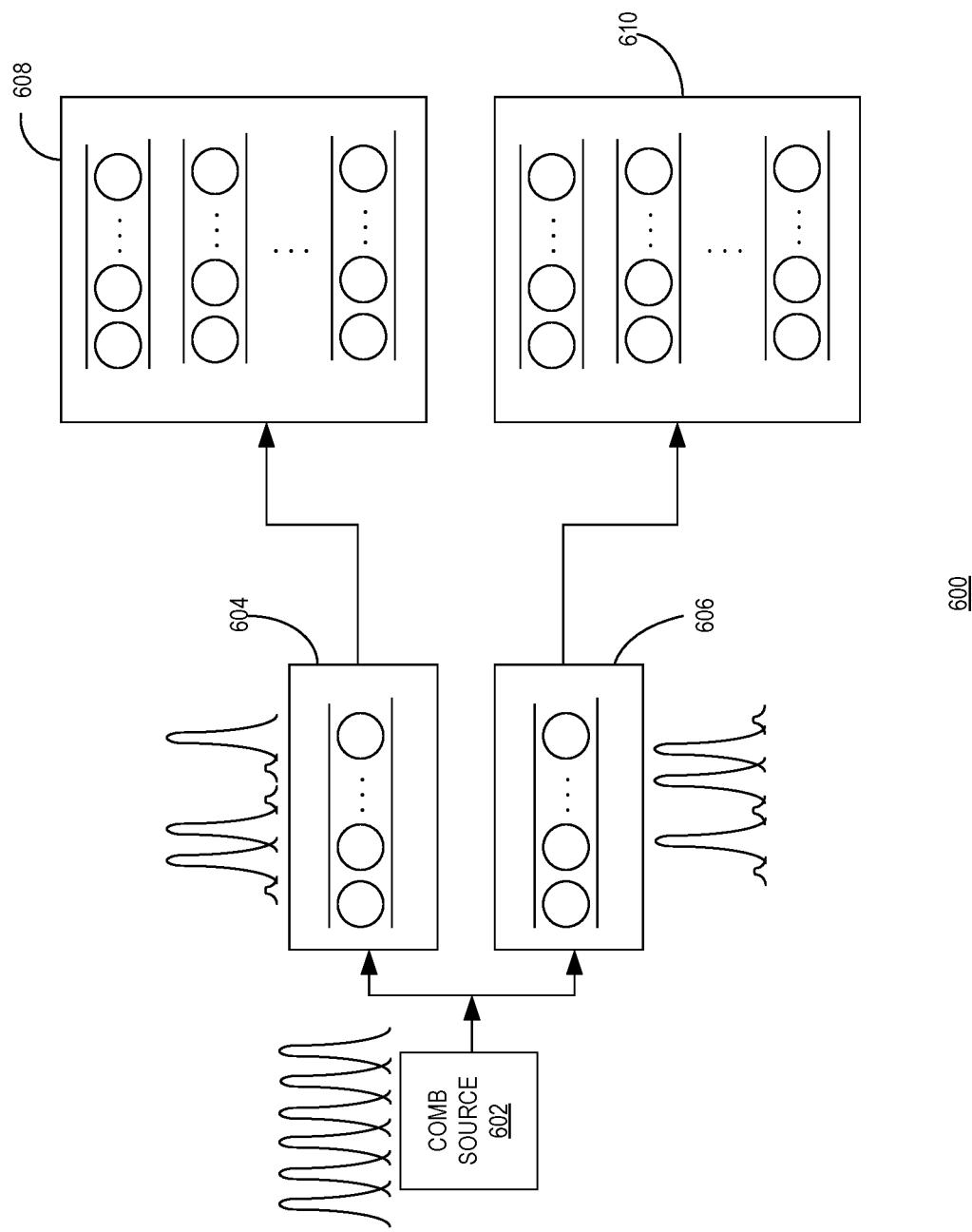
FIG. 6 illustrates an exemplary TCAM system, according to one embodiment.

In some embodiments, multiple search words can be generated in parallel, using the same comb source, to further improve the efficiency of the search system. FIG. 6 illustrates an exemplary TCAM system, according to one embodiment. TCAM system 600 can include a comb source 602 configured to generate a multi-wavelength optical comb. The number of wavelengths generated by comb source 602 can determine the maximum length of the search word. For TCAM, each bit is assigned two wavelengths. Hence, if comb source 602 can generate 64 wavelengths, then the maximum length of the search word can be 32 bits. Increasing the number of wavelengths generated by comb source 602 can increase the length of the search word.

In FIG. 6, the output of comb source 602 is sent to two filter arrays 604 and 606. Each filter array can include a number of filters configured to modify the spectrum of the output of comb source 602. The filters can be sequentially coupled to each other with a common output such that the optical comb sequentially passes each individual filter, allowing each filter to modify a portion of its spectrum. More specifically, depending on the bit values of a search word, each filter within the filter array can be tuned to a predetermined wavelength, causing light with particular wavelengths to be outputted by the filter array while light with other wavelengths will be blocked by the filter array. This way, the search word is encoded into the spectrum of the outputted light. Various mappings between the output spectrum and the search words can be implemented, depending on the algorithm. In FIG. 6, each filter array can be configured differently to generate two different search signals in parallel.

In some embodiments, each filter array can include a number ring filters that have a common input waveguide and a common output waveguide. Depending on the algorithm, the search signal may be outputted from the common drop port or the common pass port of the ring filters. In one embodiment, the ring filters can include silicon photonic microring resonators and the search signal is outputted from the common drop ports of these ring resonators. In addition, tuning of the ring resonators can be achieved using a free-carrier modulation technique, which can include injection or depletion of free carriers in the ring waveguide.

Each search signal can be sent to a TCAM memory bank (e.g., memory banks 608 and 610) having a number of parallel search circuits, with each circuit comprising a number of filters and at least a photo detector, and the setting of each filter (e.g., the passing/blocking wavelength) corresponds to a stored bit value. In some embodiments, the filters in the memory banks can include microring resonators and the bit values are stored in the resonate states of the corresponding resonators. In one embodiment, the resonate state of a stored bit and the resonate state of a search bit can be opposite to each other (e.g., as indicated by Tables 1 and 2), such that a matching entry results in all wavelengths being blocked.

A search signal can be fed to the parallel search circuits and the photo detector coupled to a search circuit generates an electrical output (e.g., a current) to indicate whether a match is found. In one embodiment, a match is found if the amount of light detected at the corresponding photo detector is below a predetermined threshold. This allows for a parallel search of a large number of stored entries. More specifically, matching entries can be found in one clock cycle. In the examples shown in FIG. 2, two search words are used to search two memory banks, further enhancing the level of parallelization and efficiency.

Figure 7:
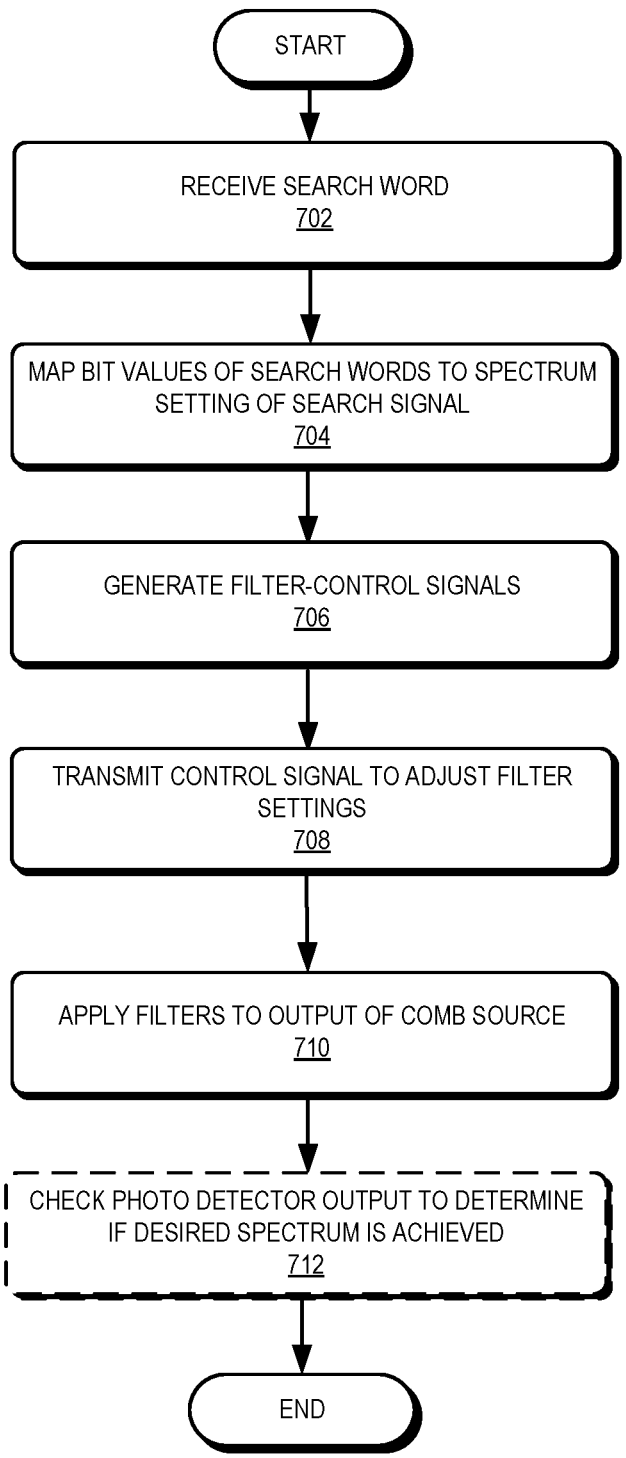
FIG. 7 presents a flowchart illustrating an exemplary operation process of the encoder, according to one embodiment.

FIG. 7 presents a flowchart illustrating an exemplary operation process of the encoder, according to one embodiment. During operation, the controller module of the encoder receives a search word (operation 702) and maps bits values of the search word to wavelength or spectrum settings of the search signal (operation 704). The mapping between the bit values and the spectrum settings can be similar to what is shown in Table 2. Depending on the algorithm, different mappings can also be possible.

Based on the spectrum setting of the search signal and the filter-controlling mechanism being implemented (e.g., local heating or carrier modulation), the controller module of the encoder can generate filter-control signals (e.g., currents or voltages) that can be used to adjust the setting of each filter (operation 706). In some embodiments, the filters are microring resonators and adjusting the filter setting can include tuning the resonance wavelength of each filter to a desired value. In further embodiments, the resonance wavelength of a microring resonator can be tuned by modulating the amount of free carriers in the ring waveguide or by applying heat to the ring waveguide. Depending on the implementation, the controller module can subsequently transmit the control signals to carrier modulators or heaters coupled to the filters (operation 708). A control signal can indicate the amount of current or voltage to be applied to the electrodes coupled to a filter. The filters can then be applied to the output of a comb source to modify the spectrum of the optical comb, thus generating a search signal corresponding to the search word (operation 710). In some embodiments, each filter can be coupled to a photo detector, and the system can optionally determine whether the desired output spectrum is achieved by checking the measurement outcome of each photo detector (operation 712). Tuning of the filters can be performed in iterations until the desired spectrum is achieved.

Figure 8:
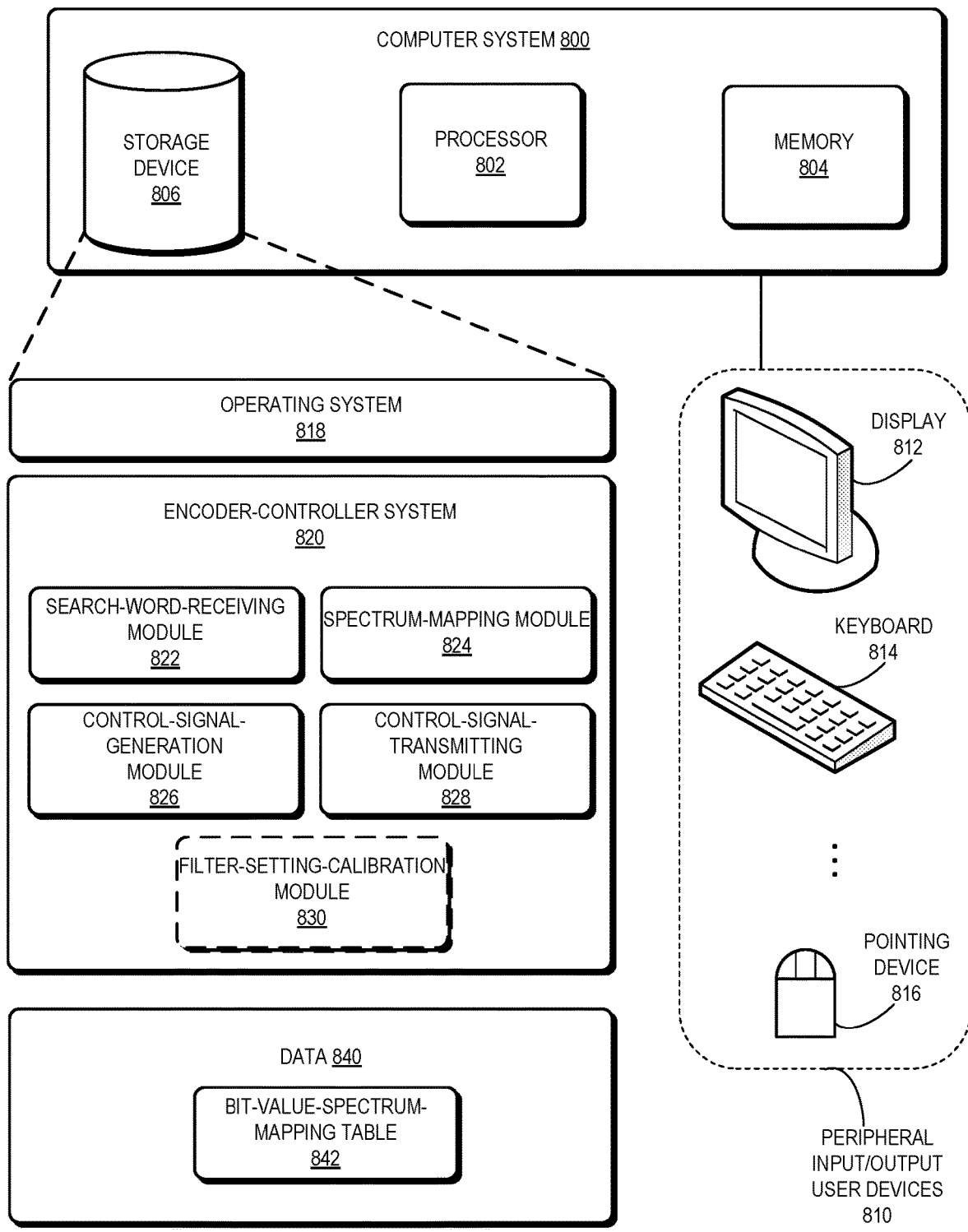
FIG. 8 illustrates an exemplary computer system that facilitates the operation of the optical encoder, according to one embodiment.

FIG. 8 illustrates an exemplary computer system that facilitates the operation of the optical encoder, according to one embodiment. Computer system 800 includes a processor 802, a memory 804, and a storage device 806. Furthermore, computer system 800 can be coupled to peripheral input/output (I/O) user devices 810, e.g., a display device 812, a keyboard 814, and a pointing device 816. Storage device 806 can store an operating system 818, an encoder-controller system 820, and data 840.

Encoder-controller system 820 can include instructions, which when executed by computer system 800, can cause computer system 800 or processor 802 to perform methods and/or processes described in this disclosure. Specifically, encoder-controller system 820 can include instructions for receiving a search word (search-word-receiving module 822), instructions for mapping bit values of the search word to the spectrum of the search signal (spectrum-mapping module 824), instructions for generating control signals (control-signal-generation module 826), instructions for transmitting control signals (control-signal-transmitting module 828), and optional instructions for calibrating the filter settings (filter-setting-calibration module 830). Data 840 can include a bit-value-spectrum mapping table 842 that maintains the mapping relationship between the bit values and the spectrum of the search signal.

In general, the disclosed embodiments provide an optical encoder for an optical TCAM module. The optical encoder can include a comb source configured to generate a multi-wavelength optical comb and a number of filters configured to modify the spectrum of the multi-wavelength optical comb to generate a search signal in order to convert different bit values of different bit positions of the search word to corresponding spectrum peaks or nulls at different wavelengths of the search signal. More specifically, each bit position is associated with two wavelengths, and ternary bit values (0, 1, and "don't care") of the bit position can be encoded into a combination of the peaks and nulls at these two wavelengths. In some embodiments, the filters include add-drop microring resonators and the spectrum peaks and nulls at desired wavelengths can be generated by tuning the resonance wavelengths of the microring resonators. In one particular embodiment, the search signal is outputted by the encoder at the common drop port of the ring resonators. The search signal can be used to search an optical TCAM, where the ternary bit values can be stored using the resonate states of the corresponding microring resonators.

One embodiment provides an optical encoder. The optical encoder includes an optical comb source to generate a multi-wavelength optical signal; a number of optical filters sequentially coupled to the optical comb source, with a respective optical filter being tunable to pass or block a particular wavelength of the multi-wavelength optical signal based on a corresponding bit value of a multi-bit search word; and a common output for the optical filters to output the filtered multi-wavelength optical signal, which encodes the multi-bit search word and can be used as an optical search signal for searching an optical content-addressable memory (CAM).

In a variation on this embodiment, the optical filters can include optical add-drop ring resonators.

In a further variation, the common output for the optical filters can include a common drop port of the optical add-drop ring resonators.

In a further variation, a bit position in the multi-bit search word can be associated with two wavelengths selected from wavelengths provided by the multi-wavelength optical signal, and one or more of the two wavelengths are passed or blocked by at least one ring resonator.

In a further variation, the bit position in the multi-bit search word can be associated with two ring resonators, one for each wavelength associated with the bit position.

In a further variation, a logical "0" or "1" of the bit position corresponds to the two ring resonators being tuned separately to pass one of the two wavelengths, and a "don't care" value of the bit position corresponds to the two ring resonators being tuned to block both wavelengths.

In a further variation, the bit position in the multi-bit search word can be associated with a single ring resonator.

In a further variation, a logical "0" or "1" of the bit position corresponds to the single ring resonator being tuned to pass one of the two wavelengths, and a "don't care" value of the bit position corresponds to the single ring resonator being tuned to block both wavelengths.

In a variation on this embodiment, the optical filters can include silicon photonic microring resonators.

In a further variation, a respective silicon photonic microring resonator can be coupled to a plurality of electrodes that facilitate tuning a resonance wavelength of the silicon photonic microring resonator by applying heat or carrier modulation.

One embodiment provides an optical content-addressable memory (CAM) system. The CAM system can include an optical memory bank comprising a plurality of optical CAM-cell arrays to store a plurality of words and a search signal generator to generate an optical search signal used for searching the optical memory bank based on a search word. A respective optical CAM-cell array can include a first set of sequentially coupled optical filters, and a respective bit value of a stored word corresponds to states of one or more corresponding optical filters. The search signal generator can include a source to generate a multi-wavelength optical signal; a second set of optical filters sequentially coupled to the source, with a respective optical filter in the second set being tunable to pass or block a particular wavelength of the multi-wavelength optical signal based on a corresponding bit value of the search word; and a common output for the second set of optical filters to output the filtered multi-wavelength optical signal as the optical search signal, which encodes the multi-bit search word.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. An optical encoder, comprising:
   an optical comb source to generate a multi-wavelength optical signal;
   a number of optical filters sequentially coupled to the optical comb source, wherein a respective optical filter is tunable to pass or block a particular wavelength of the multi-wavelength optical signal based on a corresponding bit value of a multi-bit search word; and
   a common output for the optical filters to output the filtered multi-wavelength optical signal, which encodes the multi-bit search word and can be used as an optical search signal for searching an optical content-addressable memory (CAM).

2. The optical encoder of claim 1, wherein the optical filters comprise optical add-drop ring resonators.

3. The optical encoder of claim 2, wherein the common output for the optical filters comprises a common drop port of the optical add-drop ring resonators.

4. The optical encoder of claim 2, wherein a bit position in the multi-bit search word is associated with two wavelengths selected from wavelengths provided by the multi-wavelength optical signal, and wherein one or more of the two wavelengths are passed or blocked by at least one ring resonator.

5. The optical encoder of claim 4, wherein the bit position in the multi-bit search word is associated with two ring resonators, one for each wavelength associated with the bit position.

6. The optical encoder of claim 5, wherein a logical "0" or "1" of the bit position corresponds to the two ring resonators being tuned separately to pass one of the two wavelengths, and wherein a "don't care" value of the bit position corresponds to the two ring resonators being tuned to block both wavelengths.

7. The optical encoder of claim 4, wherein the bit position in the multi-bit search word is associated with a single ring resonator.

8. The optical encoder of claim 7, wherein a logical "0" or "1" of the bit position corresponds to the single ring resonator being tuned to pass one of the two wavelengths, and wherein a "don't care" value of the bit position corresponds to the single ring resonator being tuned to block both wavelengths.

9. The optical encoder of claim 1, wherein the optical filters comprise silicon photonic microring resonators.

10. The optical encoder of claim 9, wherein a respective silicon photonic microring resonator is coupled to a plurality of electrodes that facilitate tuning a resonance wavelength of the silicon photonic microring resonator by applying heat or carrier modulation.

11. An optical content-addressable memory (CAM) system, comprising:
an optical memory bank comprising a plurality of optical CAM-cell arrays to store a plurality of words, wherein a respective optical CAM-cell array comprises a first set of sequentially coupled optical filters, and wherein a respective bit value of a stored word corresponds to states of one or more corresponding optical filters; and
a search signal generator to generate an optical search signal used for searching the optical memory bank based on a search word, wherein the search signal generator comprises:
an optical comb source to generate a multi-wavelength optical signal;
a second set of optical filters sequentially coupled to the optical comb source, wherein a respective optical filter in the second set is tunable to pass or block a particular wavelength of the multi-wavelength optical signal based on a corresponding bit value of the search word; and
a common output for the second set of optical filters to output the filtered multi-wavelength optical signal as the optical search signal, which encodes the multi-bit search word.

12. The optical CAM system of claim 11, wherein the first and second sets of optical filters comprise, respectively, first and second sets of optical add-drop ring resonators.

13. The optical CAM system of claim 12, wherein the common output for the second set of optical filters comprises a common drop port of the second set of optical add-drop ring resonators.

14. The optical CAM system of claim 12, wherein a bit position in the search word is associated with two wavelengths selected from wavelengths provided by the multi-wavelength optical signal, and wherein one or more of the two wavelengths are passed or blocked by at least one ring resonator of the second set of ring resonators.

15. The optical CAM system of claim 14, wherein the bit position in the search word is associated with two ring resonators, one for each wavelength associated with the bit position.

16. The optical CAM system of claim 15, wherein a logical "0" or "1" of the bit position corresponds to the two ring resonators being tuned separately to pass one of the two wavelengths, and wherein a "don't care" value of the bit position corresponds to the two ring resonators being tuned to block both wavelengths.

17. The optical CAM system of claim 14, wherein the bit position in the search word is associated with a single ring resonator.

18. The optical CAM system of claim 17, wherein a logical "0" or "1" of the bit position corresponds to the single ring resonator being tuned to pass one of the two wavelengths, and wherein a "don't care" value of the bit position corresponds to the single ring resonator being tuned to block both wavelengths.

19. The optical CAM system of claim 11, wherein the first and second sets of optical filters comprise silicon photonic microring resonators.

20. The optical CAM system of claim 19, wherein a respective silicon photonic microring resonator is coupled to a plurality of electrodes that facilitate tuning a resonance wavelength of the silicon photonic microring resonator by applying heat or carrier modulation.

* * * * *